US007781272B2

(12) United States Patent
Li

(10) Patent No.: US 7,781,272 B2
(45) Date of Patent: Aug. 24, 2010

(54) METHOD FOR MANUFACTURING A PIXEL STRUCTURE OF A LIQUID CRYSTAL DISPLAY

(75) Inventor: Chen-Yueh Li, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 34 days.

(21) Appl. No.: 12/105,748

(22) Filed: Apr. 18, 2008

(65) Prior Publication Data

US 2009/0061571 A1 Mar. 5, 2009

(30) Foreign Application Priority Data

Aug. 31, 2007 (TW) .............................. 96132431 A

(51) Int. Cl.
*H01L 21/84* (2006.01)
(52) U.S. Cl. .................. 438/155; 438/149; 438/151; 438/153; 438/154; 438/166
(58) Field of Classification Search ................ 438/149, 438/151, 153, 154, 155, 166, FOR. 184, FOR. 201
See application file for complete search history.

(56) References Cited

U.S. PATENT DOCUMENTS

| 6,403,409 | B1 | 6/2002 | You |
| 6,734,034 | B2 | 5/2004 | Shih |
| 7,064,021 | B2 | 6/2006 | Chang |
| 2005/0112790 | A1* | 5/2005 | Lan et al. .................... 438/30 |
| 2006/0186409 | A1* | 8/2006 | Horino et al. ................ 257/59 |
| 2008/0029767 | A1* | 2/2008 | Nagata et al. ................ 257/72 |
| 2009/0201482 | A1* | 8/2009 | Ozaki et al. ................. 355/71 |

FOREIGN PATENT DOCUMENTS

| TW | 519766 | 2/2003 |
| TW | 525301 | 3/2003 |
| TW | 558837 | 10/2003 |

OTHER PUBLICATIONS

Taiwanese language office action mailed May 26, 2010.
English language translation of Taiwanese language office action.
English language translation of abstract of TW 519766.
English language translation of abstract of TW 558837.
English language translation of abstract of TW 525301.

* cited by examiner

*Primary Examiner*—Matthew Smith
*Assistant Examiner*—Joannie A Garcia
(74) *Attorney, Agent, or Firm*—Thoman, Kayden, Horstemeyer & Risley

(57) ABSTRACT

A method for manufacturing the pixel structure of a liquid crystal display is provided. In comparison to using seven masks in the conventional lithographic processes for the pixel structure, only four masks are required in the manufacturing method of the present invention. Therefore, the cost of manufacturing is reduced. Furthermore, the unnecessary multi-layer structures on the display area can be removed in the manufacturing processes, and thus, enhance the transmittance thereof.

21 Claims, 12 Drawing Sheets

METHOD FOR MANUFACTURING A PIXEL STRUCTURE OF A LIQUID CRYSTAL DISPLAY

This application claims the benefits of the priority based on Taiwan Patent Application No. 096132431 filed on Aug. 31, 2007; the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to a method for manufacturing a pixel structure of a liquid crystal display (LCD). More particularly, the present invention relates to a method that uses only four masks to manufacture the pixel structure of a low temperature poly-silicon thin-film transistor liquid crystal display (LTPS-TFTLCD).

2. Descriptions of the Related Art

With low power consumption, light weight, low radiation and good portability, the LCD has become the dominant product in today's display market. Among various LCDs, the thin-film transistor liquid crystal display (TFT-LCD) technology falls into two main categories: amorphous silicon (referred to α-Si in short) and poly-silicon (Poly-Si). In the Poly-Si LCD, the low temperature poly-silicon (LTPS) is the new generation of manufacturing technology. As compared to the conventional α-Si LCD, the LTPS transistor has a carrier mobility of more than 200 times higher, and the display made therefrom features higher response, higher luminance, higher resolution and higher color saturation, thus, presenting a better picture quality. Moreover, with a lighter and slimmer profile, the LTPS display may have smaller components, resulting in shrinkage of more than 50% in area of the overall TFT assembly, thus, effectively reducing the power consumption and the manufacturing cost thereof. Therefore, the LTPS LCD is becoming increasingly popular on the LCD market.

FIG. 1A illustrates the schematic view of a pixel array formed on a substrate in a conventional LCD panel. The pixel array 1 comprises a plurality of scan lines 10 and data lines 11 intersecting with each other to define a plurality of pixel areas. Each of the pixel areas has a display unit 121 and a control element 123 formed thereon respectively. In addition, each of the scan lines 10 and the data lines 11 is connected to a plurality of pads 101, 111 disposed at the edges of the substrate respectively to transmit signals.

FIG. 1B illustrates a schematic cross-sectional view of such a structure, in which each of the pixel areas formed on a substrate 13 may be divided into a control area 131, a capacitance area 133 and a display area 135. In addition, a pad area 137 extending at the periphery of the substrate 13 is further illustrated in FIG. 1B.

In the conventional LTPS manufacturing technology of a pure PMOS product, seven masks are typically needed to perform exposure processes to form such a structure progressively. In particular, a poly-silicon layer 14 is firstly formed on the control area 131 and the capacitance area 133 by using a first mask. Next, a partial area of the poly-silicon layer 14 is doped with P+ ions by using a second mask to form a conductive structure 141. After the dielectric layer 15 is formed in the large area, a gate electrode layer 16 is formed on the control area 131, the capacitance area 133 and the pad area 137 respectively by using a third mask. Subsequently, once an intermediate dielectric layer 17 is formed to overlay the above-mentioned structure, an etch process is performed by using a fourth mask to form via holes to partially expose the poly-silicon layer 14 doped with P+ ions in the control area 131 and the capacitance area 133, and also to expose the gate electrode layer 16 in the pad area 137. Then, by using a fifth mask, a metallic conductive layer 18 is formed, which is electrically connected with the poly-silicon layer 14 through the via holes in the control area 131 and the capacitance area 133 respectively, and the gate electrode layer 16 in the pad area 137. Afterwards, a planarization layer 19 is formed, and a sixth mask is used to partially expose the metallic conductive layer 18. Finally, a transparent electrode 191 is formed by using a seventh mask, and is electrically connected with the metallic conductive layer 18.

Unfortunately, because masks are relatively expensive, the more masks that are used, the higher the manufacturing costs. Further, a manufacturing process involving masks is rather complex, which tends to decrease the yield rate of the products and therefore cannot satisfy the manufacturing requirements of current LCD. Moreover, because the display area 135 in a conventional structure still incorporates an ineffective multilayer structure, light from the substrate 13 has to transmit therethrough before it can result in a display. Even when such a structure is made of a transparent material, an adverse impact is still imposed on the transmittance of the display area 135, thus compromising the competitiveness of the products.

In view of this, it is highly desirable in the art to provide a method for manufacturing a low temperature poly-silicon liquid crystal display (LTPS-LCD) which uses fewer masks and can improve the transmittance of the display area.

SUMMARY OF THE INVENTION

One objective of this invention is to provide a method for manufacturing the pixel structure of an LCD. In the manufacturing processes of this invention, only four masks are needed to form a desired structure. As a result, the manufacturing processes of the complete TFT, the storage capacitor and the pad structures may be simplified, thereby shortening the manufacturing period and reducing the manufacturing costs significantly.

Another objective of this invention is to provide a method for manufacturing the pixel structure of an LCD. Because of the pixel structure resulting from the manufacturing process of this invention, the ineffective layers are eliminated from the display area and the transmittance of the display pixels is improved, thus resulting in a better display effect.

To this end, a method for manufacturing the pixel structure of an LCD is disclosed in this invention. The LCD comprises a substrate, on which a plurality of pixel areas and pad areas are defined, with each of the pixel areas comprising a control area and a capacitance area. The method of this invention comprises the following steps: forming a poly-silicon layer on the control area and the capacitance area of the substrate; forming a first dielectric layer on the poly-silicon layer; forming a gate electrode layer on the first dielectric layer; forming a first patterned photo-resist layer on the control area, capacitance area and pad area; partially retaining the poly-silicon layer, the first dielectric layer and the gate electrode layer on the control area, capacitance area and pad area; etching a portion of the gate electrode layer to partially expose the first dielectric layer; doping the poly-silicon layer to form a first and a second conductive portions in the poly-silicon layer of the control area and the capacitance area respectively, so as to form a TFT structure on the control area and form a capacitance structure on the capacitance area; removing the first patterned photo-resist layer; forming an intermediate dielectric layer overlaying the TFT structure, capacitance structure and pad structure on the pad area; forming a transparent electrode layer overlaying the intermediate dielectric layer; partially removing the transparent electrode layer and the intermediate dielectric layer to partially expose the first conductive portion, second conductive portion and pad structure; forming a metallic layer electrically connected with the first conductive portion, second conductive portion and exposed portion of the pad structure; and forming a passivation layer overlaying the metallic layer and partially exposing the transparent electrode layer on the capacitance area.

The detailed technology and preferred embodiments implemented for the subject invention are described in the following paragraphs accompanying the appended drawings for the people skilled in this field to well appreciate the features of the claimed invention.

DESCRIPTION OF THE PREFERRED EMBODIMENT

Figure 1A:
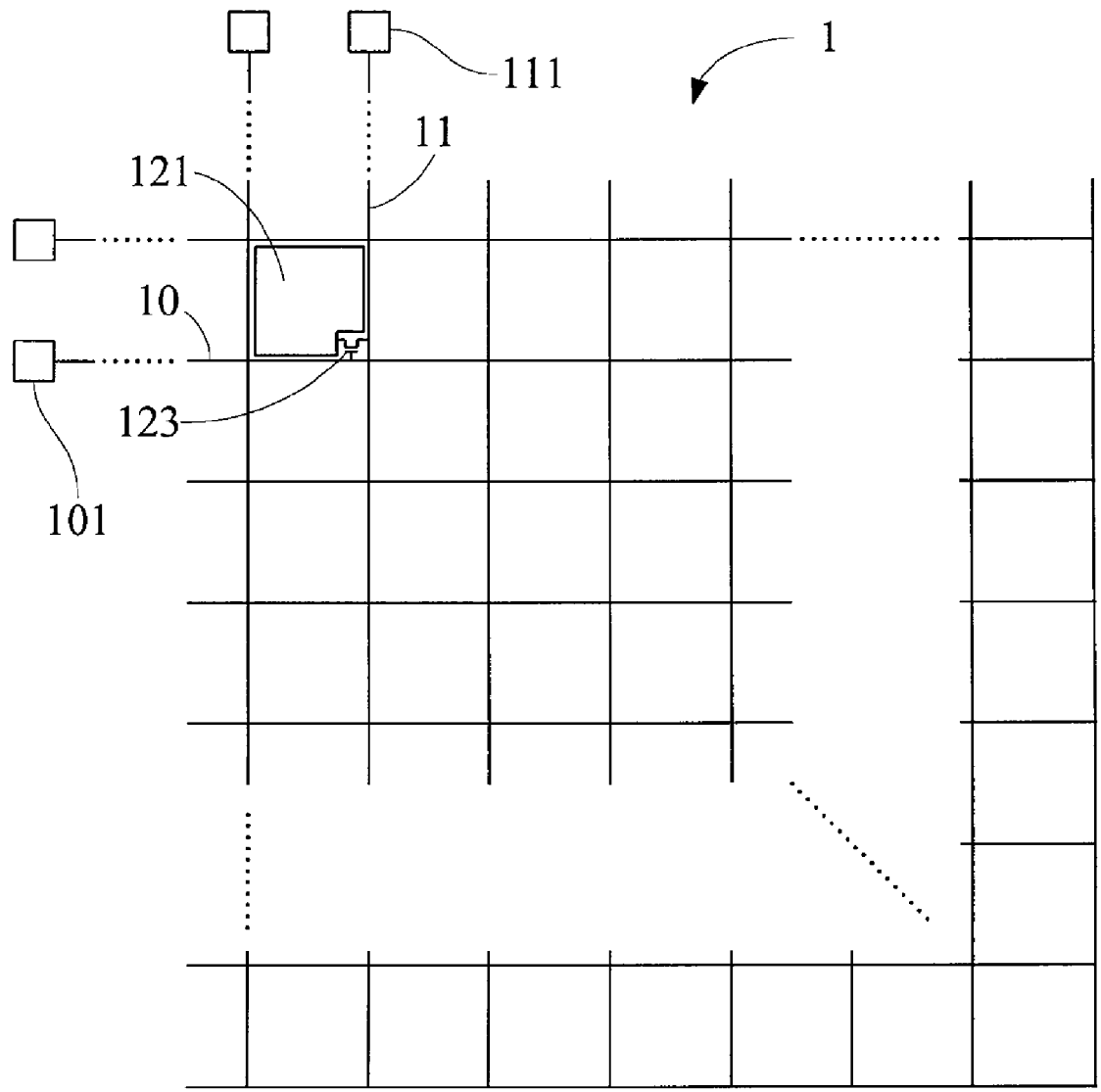
FIG. 1A is a schematic view of a pixel array of a conventional LCD panel.
Figure 1B:
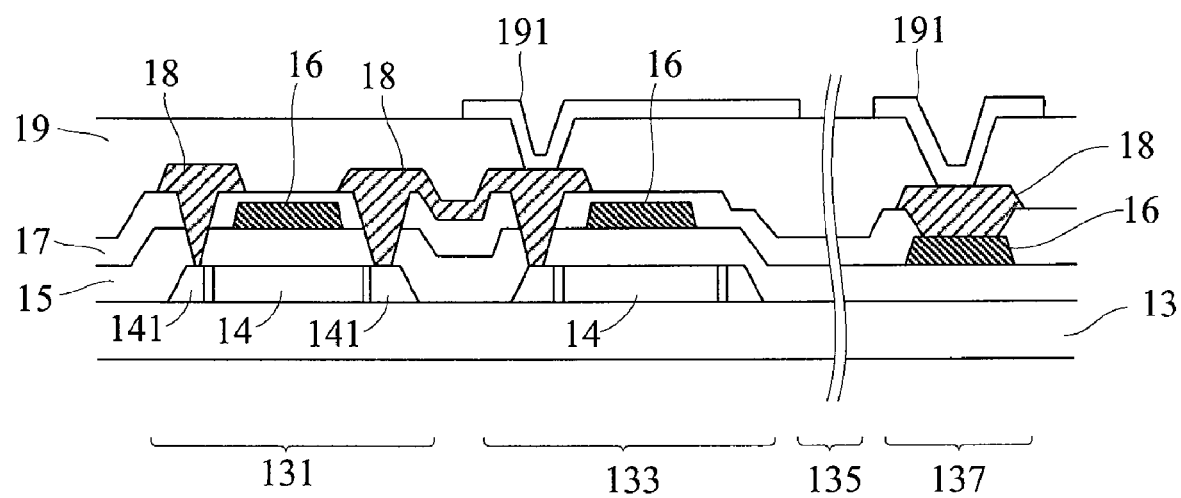
FIG. 1B is a schematic cross-sectional view of a conventional pixel structure.
Figure 2:
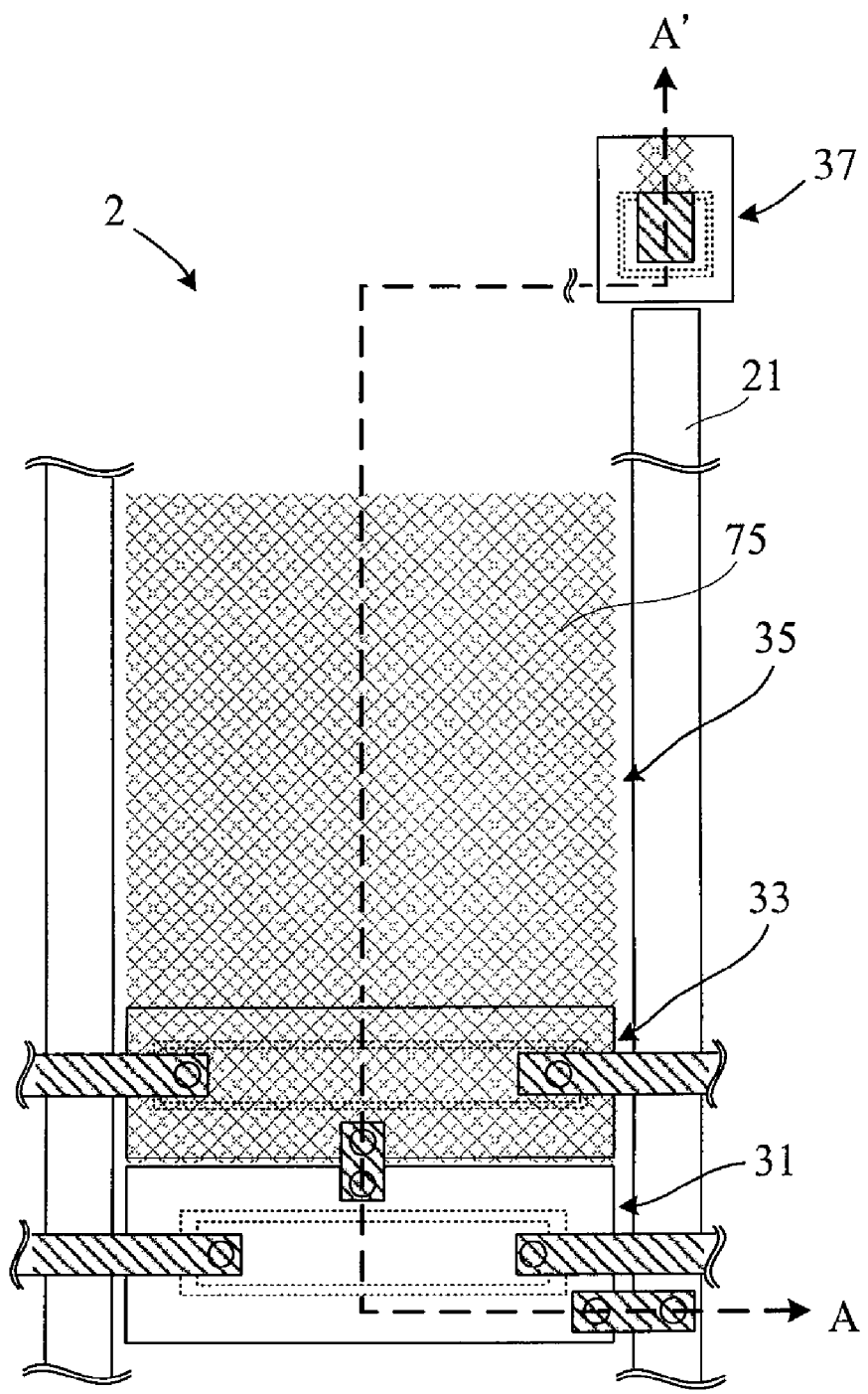
FIG. 2 is a schematic view of a pixel in a pixel structure of this invention.

This invention is applicable to an LCD, and particularly to a low temperature poly-silicon liquid crystal display (LTPS-LCD). The LCD comprises a substrate, on which a plurality of pixel areas and pad areas are defined. FIG. 2 illustrates a schematic plan view of a pixel structure 2 formed by the manufacturing processes of this invention, and for purpose of simplicity, only one pixel area is illustrated therein. FIG. 2 illustrates a TFT structure 31, a capacitance structure 33, a display structure 35 and a pad structure 37 disposed at the periphery of the substrate. The pad structure 37 is adapted to connect with the data line 21 to transmit or receive a voltage signal, and similarly, the scan line is also connected to a corresponding pad structure.

Figure 3:
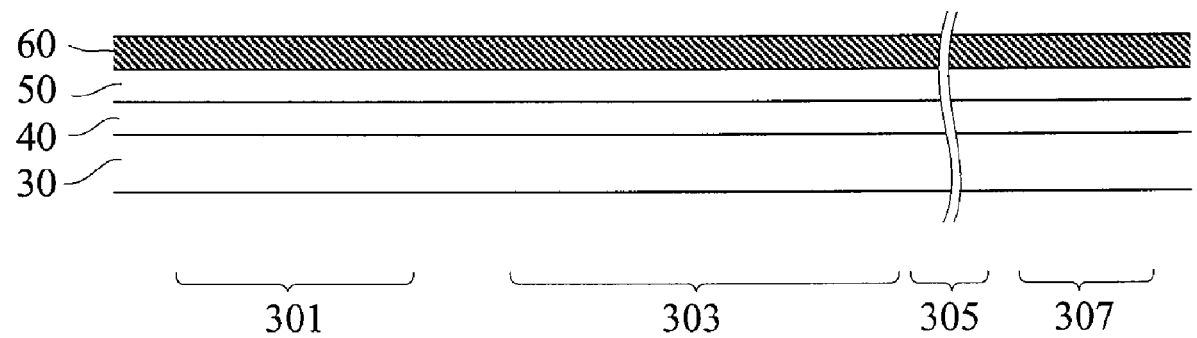
FIGS. 3 to 11 are schematic views of a process for manufacturing a pixel structure of this invention.

A method for manufacturing a pixel structure of an LCD as disclosed in this invention is illustrated in FIGS. 3-11 sequentially. It should be noted that the cross-sectional views of the structure taken along the line A-A' in FIG. 2 is illustrated in FIG. 3 to FIG. 11. For the convenience of description, the substrate 30 may be divided into a control area 301, a capacitance area 303, a display area 305 and a pad area 307. Initially, as shown in FIG. 3, a poly-silicon layer 40 is firstly formed on at least the control area 301 and the capacitance area 303 of the substrate 30. More particularly, the amorphous silicon layer is firstly formed on the substrate 30, and is then transformed into the poly-silicon layer 40 by an excimer laser annealing (ELA) process. Next, a first dielectric layer 50 is formed on the poly-silicon layer 40, and a gate electrode layer 60 is in turn formed on the first dielectric layer 50.

Figure 4:
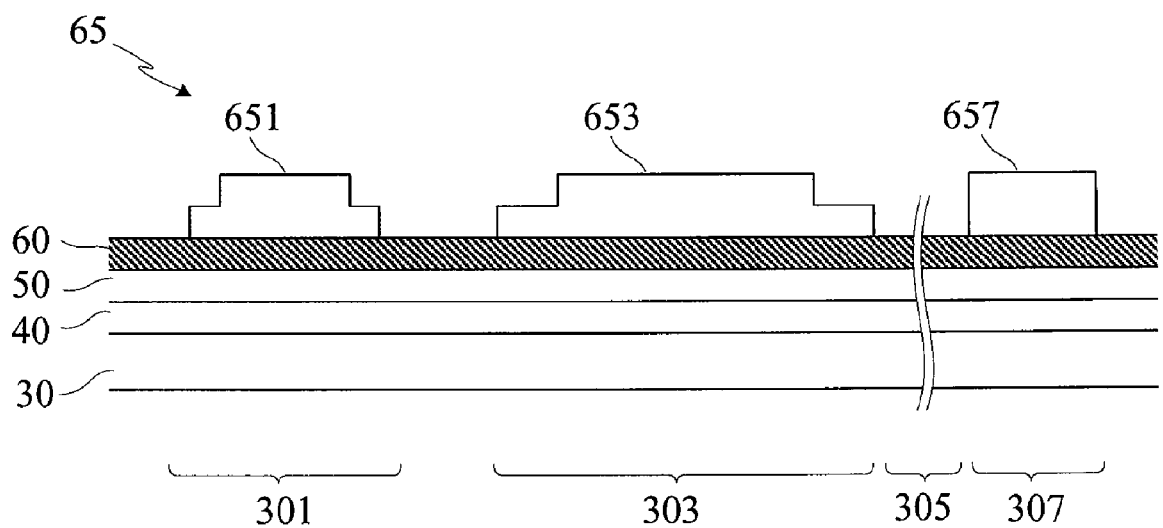
Figure 5:
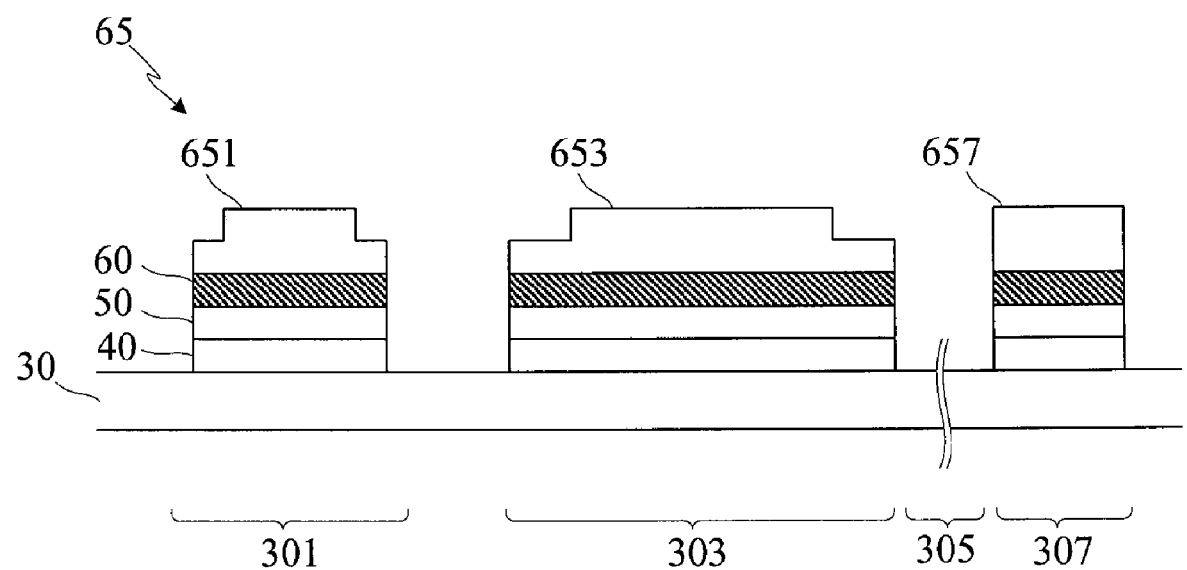

Subsequently, as shown in FIG. 4, in the first photolithography process, a first patterned photo-resist layer 65 is formed on the control area 301, the capacitance area 303 and the pad area 307. Preferably, during the formation of the first patterned photo-resist layer 65 using a half-tone mask controlling the exposure energy, the photo-resist layer structures 651, 653, 657 of different thicknesses depending on the actual requirements are formed respectively on the control area 301, the capacitance area 303 and the pad area 307. Next, as shown in FIG. 5, by using the first patterned photo-resist layer 65 as a mask, an etching process is performed to remove the exposed portions of the poly-silicon layer 40, the first dielectric layer 50 and the gate electrode layer 60, and partially retain the poly-silicon layer 40, the first dielectric layer 50 and the gate electrode layer 60 in the control area 301, capacitance area 303 and pad area 307.

Figure 6:
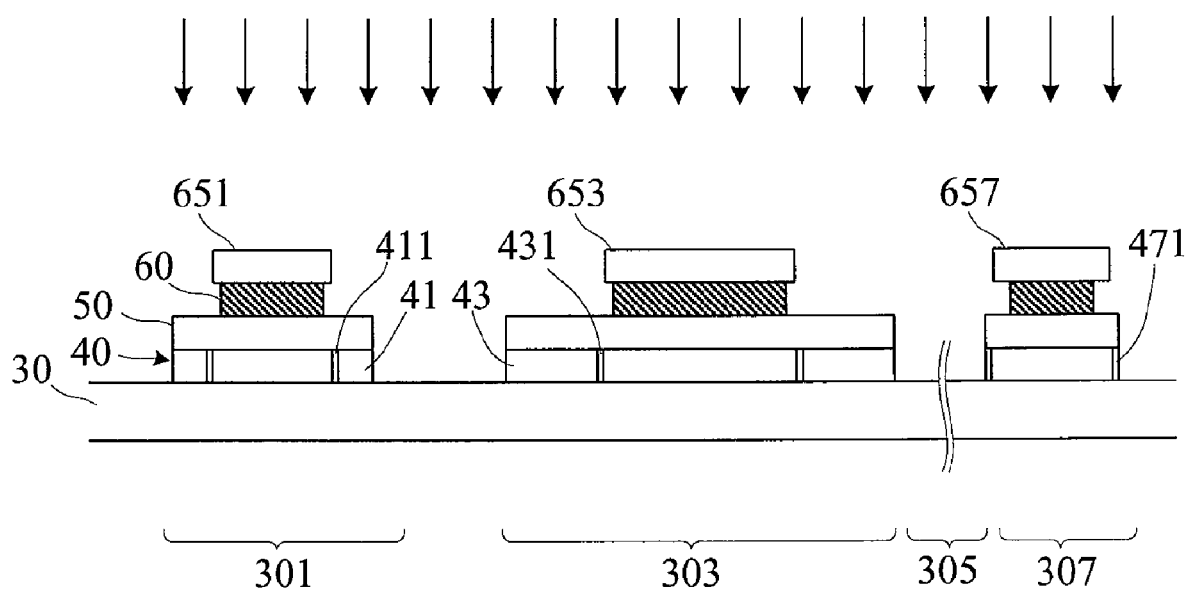

Next, an ashing process is performed on the first patterned photo-resist layer 65 to partially remove the first patterned photo-resist layer 65. Since the first patterned photo-resist layer 65 is formed with a particular thickness distribution by the half-tone mask as described above, only part of the photo-resist layer structures 651, 653, 657 are left after the ashing process, as shown in FIG. 6. Then, the gate electrode layer 60 is further etched to partially expose the first dielectric layer 50. Preferably, a wet etching process may be used in an embodiment of this invention, so that the gate electrode layer 60 is further underetched during the etching process, as shown in FIG. 6. This may ensure that the photo-resist layer structures 651, 653, 657 of the first patterned photo-resist layer 65 completely overlay the gate electrode layer 60, thereby to facilitate the subsequent manufacturing processes.

Figure 7:
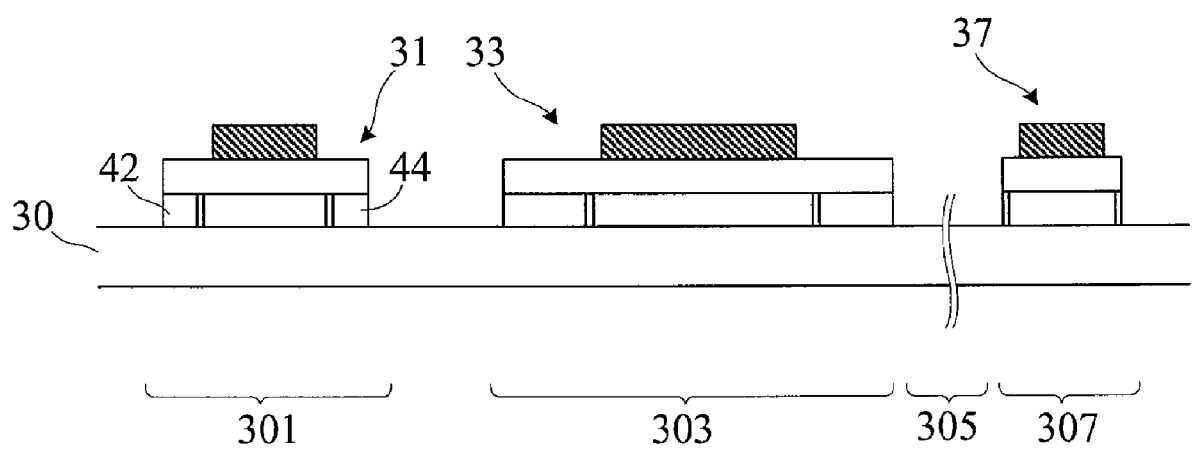

To form a TFT structure on the control area 301 and a capacitance structure on the capacitance area 303, the above structure needs to be transformed into a conductive portion. In particular, P+ ions are doped into the poly-silicon layer 40 in the control area 301 and the capacitance area 303, as shown by the arrow in FIG. 6. Because of the first patterned photo-resist layer 65, the P+ ions will be doped into only a portion of the poly-silicon layer 40 to form a first conductive portion 41 and a second conductive portion 43 in the poly-silicon layer 40 respectively. In an embodiment involving a wet etching process as described above, after the first patterned photo-resist layer 65 is removed, the control area 301, the capacitance area 303 and the pad area 307 may be further performed a lightly-doped drain (LDD) process with P− ions to form lightly-doped structures 411, 431, 471, thus enhancing the reliability of the component, as illustrated in FIG. 7. Thus, a TFT structure 31 is formed on the control area 301, a capacitance structure 33 is formed on the capacitance area 303, and a pad structure 37 is formed on the pad area 307. The first conductive portion 41 of the TFT structure 31 comprises a source electrode 42 and a drain electrode 44.

Figure 8:
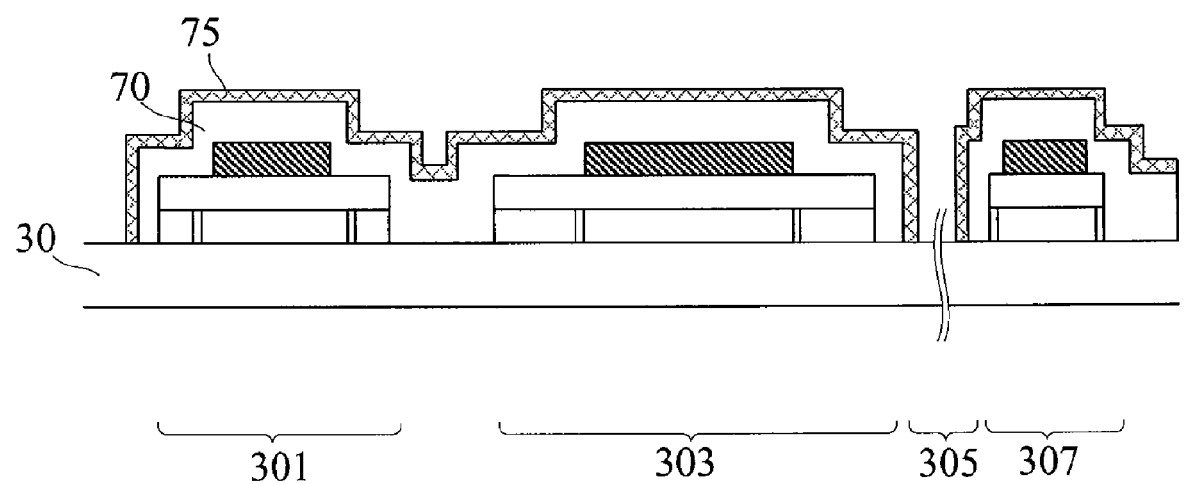
Figure 9:
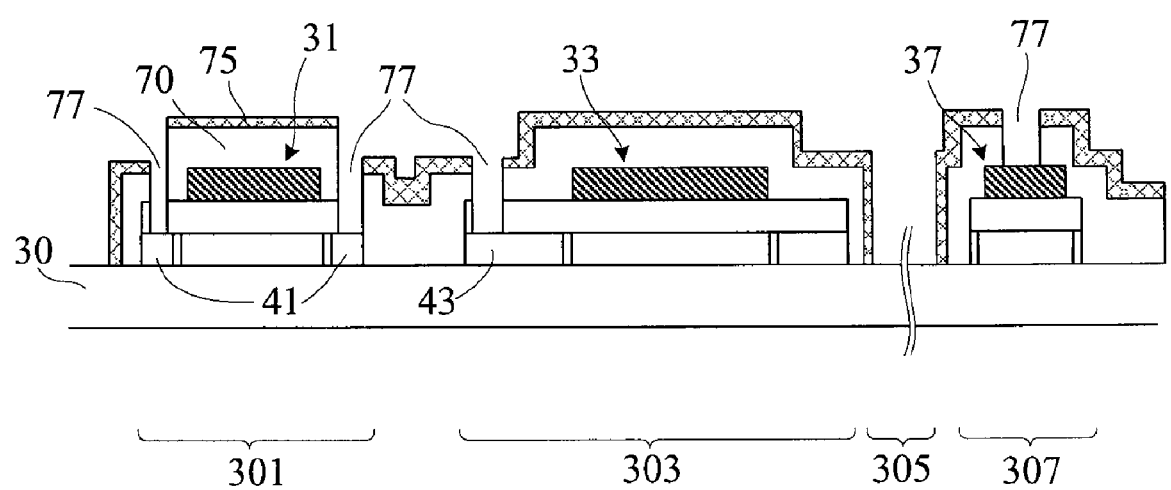

Next, as illustrated in FIG. 8, an intermediate dielectric layer 70 is formed to overlay the TFT structure 31, capacitance structure 33 and a pad structure 37 formed on the pad area 307. Further, a transparent electrode layer 75 is formed to overlay the intermediate dielectric layer 70. Preferably, the transparent electrode layer 75 is made of indium tin oxide (ITO). Then, as illustrated in FIG. 9, a second photolithography process is performed to form a second patterned photo-resist layer (not shown), followed by a second etching process to remove part of the transparent electrode layer 75 and the intermediate dielectric layer 70 to form a plurality of via holes 77 at certain locations, thus partially exposing the first conductive portion 41, the second conductive portion 43 and the pad structure 37.

Figure 10:
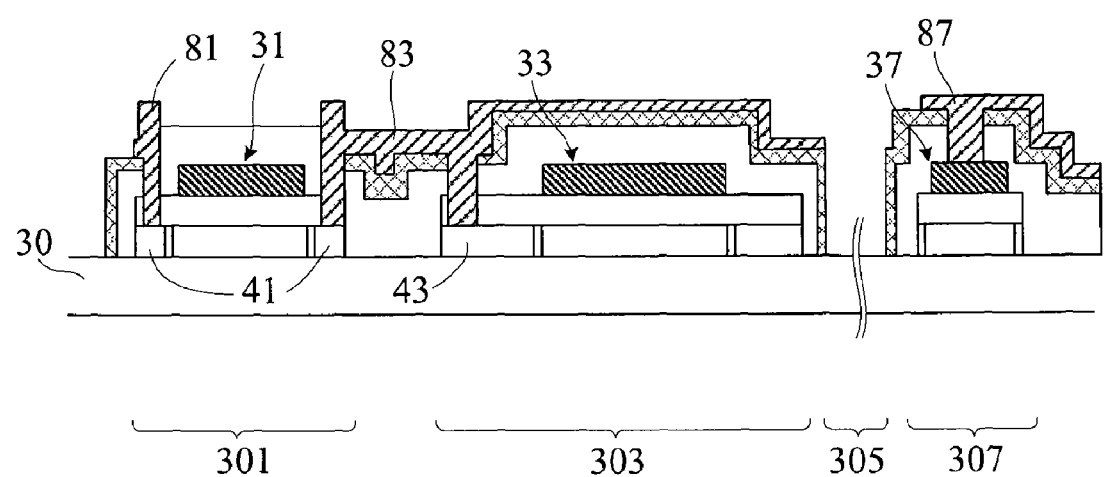

Next, as illustrated in FIG. 10, a metallic layer 80 is sputtered, followed by a third photolithography process to form a third patterned photo-resist layer (not shown). Then, a third etching process is performed to partially remove the metallic layer 80 to be electrically connected with the exposed portions of the first conductive portion 41, the second conductive portion 43 and the pad structure 37. In particular, subsequent to the third etching process described above, the metallic layer 80 may include a first metallic structure 81, a second metallic structure 83 and a third metallic structure 87. The first metallic structure 81 is electrically connected to the first conductive portion 41 (i.e., the source electrode 42 of the TFT structure 31). The second metallic structure 83 is electrically connected with both the first conductive portion 41 (i.e., the drain electrode 44 of the TFT structure 31) and the second conductive portion 43, so that the TFT structure 31 and the capacitance structure 33 are electrically connected with each other. The third metallic structure 87 is electrically connected with pad structure 37. Moreover, the third patterned photo-resist layer could be designed so that when the third etching process is performed, the transparent electrode layer above the TFT structure 31 is removed simultaneously to ensure that the source electrode 42 and the drain electrode 44 of the TFT structure 31 will not be electrically connected to each other.

Figure 11:
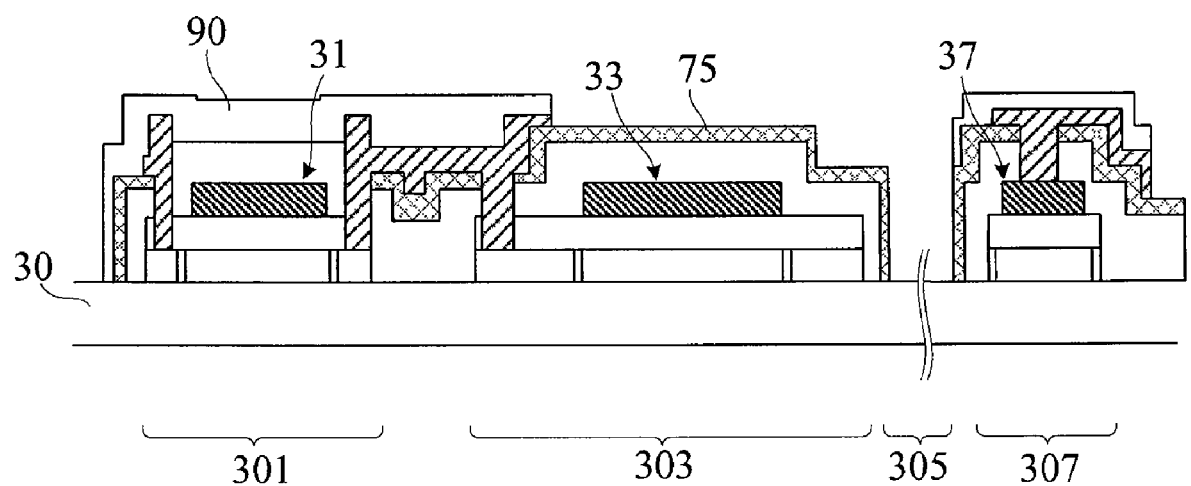

Finally, a passivation layer 90 is deposited to at least overlay the metallic layer 80. A fourth photolithography is then performed to form a fourth patterned photo-resist layer (not shown), followed by a fourth etching process to partially remove the passivation layer 90, as shown in FIG. 11. Preferably, the fourth etching process may be designed to partially remove the second metallic structure 83 simultaneously to partially expose the transparent electrode layer 75 in the capacitance area 303.

It follows from the above disclosure that the manufacturing process of this invention needs only four photolithography processes to manufacture the pixel structure of an LCD. Conceivably, a fewer number of masks lead to lower manufacturing costs. In addition, the unnecessary multilayer structures in the display area can be removed simultaneously during the manufacturing processes. Consequently, as shown in FIG. 2, only the transparent electrode layer 75, which is directly formed on the substrate, remains on the display area 305. As a result, the transmittance of the pixel is enhanced and the display effect is improved.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a pixel structure of a liquid crystal display (LCD), the LCD comprising a substrate, on which a plurality of pixel areas and pad areas are defined, each of the pixel areas comprising a control area and a capacitance area, the method comprising the steps of:
   (a) forming a thin-film transistor (TFT) structure having a gate electrode, a source electrode and a drain electrode on the control area and a capacitance structure having a conductive portion on the capacitance area, wherein the source electrode, the drain electrode and the conductive portion are made of a patterned poly-silicon layer;
   (b) forming an intermediate dielectric layer overlaying the TFT structure, the capacitance structure, and a pad structure formed on the pad area;
   (c) forming a transparent electrode layer overlaying the intermediate dielectric layer;
   (d) removing some portions of the transparent electrode layer and the intermediate dielectric layer for partially exposing the source electrode, the drain electrode, the conductive portion and the pad structure;
   (e) forming a patterned metallic layer including first, second and third metallic structures, wherein the first metallic structure electrically connects with the source electrode, the second metallic structure electrically connects with the drain electrode, the transparent electrode and the conductive portion, and the third metallic structure electrically connects with the pad structure; and
   (f) forming a patterned passivation layer overlaying the patterned metallic layer, and partially exposing the transparent electrode layer on the capacitance area.

2. The method as claimed in claim 1, wherein the step of forming the TFT structure and the capacitance structure comprises the steps of:
   forming a poly-silicon layer on the substrate;
   forming a first dielectric layer on the poly-silicon layer;
   forming a gate electrode layer on the first dielectric layer;
   forming a first patterned photo-resist layer on the control area, the capacitance area and the pad area; and
   removing exposed portions and partially remaining the poly-silicon layer, the first dielectric layer and the gate electrode layer on the control area, the capacitance area and the pad area by using the first patterned photo-resist layer as a mask.

3. The method as claimed in claim 2, wherein the step of forming a poly-silicon layer comprises the steps of:
   forming an amorphous silicon layer on the substrate; and
   transforming the amorphous silicon layer into the poly-silicon layer by performing an excimer laser annealing (ELA) process.

4. The method as claimed in claim 2, wherein the first patterned photo-resist layer is formed by using a half-tone mask.

5. The method as claimed in claim 2, after the step of partially remaining the poly-silicon layer, the first dielectric layer and the gate electrode layer, comprising the steps of:
   ashing the first patterned photo-resist layer;
   etching the gate electrode layer to partially expose the first dielectric layer;
   doping the poly-silicon layer to form the source electrode, the drain electrode and the conductive portions on the control area and the capacitance area, respectively; and
   removing the first patterned photo-resistive layer.

6. The method as claimed in claim 5, after the step of doping the poly-silicon layer, further comprising a step of:
   performing a lightly-doped drain (LDD) process on the control area, the capacitance area and the pad area.

7. The method as claimed in claim 1, wherein the step of partially exposing the source electrode, the drain electrode, the conductive portion and the pad structure comprises the steps of:
   forming a second patterned photo-resist layer; and
   performing a second etching process to partially expose the source electrode, the drain electrode, the conductive portion and the pad structure.

8. The method as claimed in claim 1, wherein the step of forming a patterned metallic layer comprises the steps of:
   sputtering a metallic layer;
   forming a third patterned photo-resist layer; and
   performing a third etching process to partially remove the metallic layer, which is formed to comprise the first, the second and the third metallic structures.

9. The method as claimed in claim 1, wherein the step of forming a passivation layer and partially exposing the transparent electrode layer comprises the steps of:
   depositing a the passivation layer;

forming a fourth patterned photo-resist layer; and performing a fourth etching process to partially remove the passivation layer and the second metallic structure to partially expose the transparent electrode layer on the capacitance area.

10. The method as claimed in claim 1, wherein the transparent electrode layer is made of indium tin oxide (ITO).

11. The method as claimed in claim 1, wherein the LCD is a low temperature poly silicon LCD (LTPS-LCD).

12. A method for manufacturing a pixel structure of a liquid crystal display (LCD), the LCD comprising a substrate, on which a plurality of pixel areas and pad areas are defined, each of the pixel areas comprising a control area and a capacitance area, the method comprising the steps of:

(a) forming a poly-silicon layer on the control area and the capacitance area on the substrate;

(b) forming a first dielectric layer on the poly-silicon layer;

(c) forming a patterned gate electrode layer on the first dielectric layer;

(d) forming a first patterned photo-resist layer on the control area, the capacitance area and the pad area;

(e) remaining the poly-silicon layer, the first dielectric layer and the patterned gate electrode layer on the control area, the capacitance area and the pad area, partially, by using the first patterned photo-resist layer as a mask;

(f) etching the patterned gate electrode layer to partially expose the first dielectric layer;

(g) doping the poly-silicon layer to form a source electrode and a drain electrode in the poly-silicon layer on the control area and a conductive portion in the poly-silicon layer on the capacitance area, thereby forming a thin-film transistor (TFT) structure on the control area and a capacitance structure on the capacitance area;

(h) removing the first patterned photo-resist layer;

(i) forming an intermediate dielectric layer overlaying the TFT structure, the capacitance structure and a pad structure on the pad area;

(j) forming a transparent electrode layer overlaying the intermediate dielectric layer;

(k) removing the transparent electrode layer and the intermediate dielectric layer to partially expose the source electrode, the drain electrode, the conductive portion and the pad structure;

(l) forming a patterned metallic layer including first, second and third metallic structures, wherein the first metallic structure electrically connects with the source electrode, the second metallic structure electrically connects with the drain electrode, the transparent electrode and the conductive portion, and the third metallic structure electrically connects with the pad structure; and (m) forming a patterned passivation layer overlaying the patterned metallic layer and partially exposing the transparent electrode layer on the capacitance area.

13. The method as claimed in claim 12, wherein the step of forming a poly-silicon layer comprises the steps of:

forming an amorphous silicon layer on the substrate; and transforming the amorphous silicon layer into the poly-silicon layer by performing an excimer laser annealing (ELA) process.

14. The method as claimed in claim 12, wherein the first patterned photo-resist layer is formed by using a half-tone mask.

15. The method as claimed in claim 12, after the step of partially remaining the poly-silicon layer, the first dielectric layer and the gate electrode layer, further comprising a step of:

ashing the first patterned photo-resist layer.

16. The method as claimed in claim 15, after the step of forming the source electrode, the drain electrode and the conductive portions, further comprising a step of:

performing a lightly-doped drain (LDD) process on the control area, the capacitance area and the pad area.

17. The method as claimed in claim 12, wherein the step of partially exposing the source electrode, the drain electrode, the conductive portion and the pad structure comprises the steps of:

forming a second patterned photo-resist layer; and performing a second etching process to partially expose the source electrode, the drain electrode, the conductive portion and the pad structure.

18. The method as claimed in claim 12, wherein the step of electrically connecting with the source electrode, the drain electrode, the conductive portion and the pad structure at exposed portions further comprises the steps of:

sputtering a metallic layer;

forming a third patterned photo-resist layer; and performing a third etching process to partially remove the metallic layer, which is formed to comprise the first metallic structure, the second metallic structure and the third metallic structure.

19. The method as claimed in claim 12, wherein the step of partially exposing the transparent electrode layer on the capacitance area comprises the steps of:

depositing the passivation layer;

forming a fourth patterned photo-resist layer; and performing a fourth etching process to partially remove the passivation layer and the second metallic structure to partially expose the transparent electrode layer on the capacitance area.

20. The method as claimed in claim 12, wherein the transparent electrode layer is made of indium tin oxide (ITO).

21. The method as claimed in claim 12, wherein the LCD is a low temperature poly silicon LCD (LTPS-LCD).

* * * * *